United States Patent
Chu

(10) Patent No.: US 7,643,293 B2
(45) Date of Patent: Jan. 5, 2010

(54) HEAT DISSIPATION DEVICE AND A METHOD FOR MANUFACTURING THE SAME

(75) Inventor: Ching-Hung Chu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 35 days.

(21) Appl. No.: 11/959,289

(22) Filed: Dec. 18, 2007

(65) Prior Publication Data

US 2009/0154105 A1 Jun. 18, 2009

(51) Int. Cl.
*H05K 7/20* (2006.01)
*F28D 15/00* (2006.01)

(52) U.S. Cl. ............ 361/700; 361/679.47; 361/679.48; 361/679.52; 361/679.54; 361/695; 361/697; 361/702; 361/704; 361/709; 361/719; 165/80.3; 165/104.33; 165/185; 174/15.2; 174/16.1; 174/16.3

(58) Field of Classification Search ................................
361/679.46–679.48, 679.52, 679.54, 694–695, 361/697, 699–700, 702–704, 709–710, 719; 165/80.3–80.5, 104.33, 185; 174/15.2, 16.1, 174/16.3
See application file for complete search history.

(56) References Cited

U.S. PATENT DOCUMENTS

| | | | | |
|---|---|---|---|---|
| 5,379,830 | A * | 1/1995 | Itoh | 165/104.27 |
| 5,829,516 | A * | 11/1998 | Lavochkin | 165/80.4 |
| 6,394,175 | B1 * | 5/2002 | Chen et al. | 165/80.3 |
| 6,651,732 | B2 * | 11/2003 | Sagal | 165/80.3 |
| D487,885 | S * | 3/2004 | Fan | D13/179 |
| 6,717,813 | B1 * | 4/2004 | Garner | 361/700 |
| 6,853,555 | B2 * | 2/2005 | Fichera et al. | 361/700 |
| 6,909,608 | B2 * | 6/2005 | Fan | 361/700 |
| 6,956,740 | B2 * | 10/2005 | Shimura et al. | 361/700 |
| 7,077,188 | B2 * | 7/2006 | Chen | 165/80.3 |
| 7,365,975 | B2 * | 4/2008 | Xia et al. | 361/695 |
| 7,367,382 | B2 * | 5/2008 | Miyazawa et al. | 165/80.3 |
| 2003/0002258 | A1 * | 1/2003 | Manabe et al. | 361/704 |
| 2004/0223303 | A1 * | 11/2004 | Hornung | 361/704 |
| 2005/0105274 | A1 * | 5/2005 | Cheng | 361/700 |

(Continued)

FOREIGN PATENT DOCUMENTS

CN 101155500 A * 4/2008

(Continued)

*Primary Examiner*—Jayprakash N Gandhi
*Assistant Examiner*—Robert Hoffberg
(74) *Attorney, Agent, or Firm*—Frank R. Niranjan

(57) ABSTRACT

A heat dissipation device and a method for fabrication thereof are disclosed. The heat dissipation device includes a heat sink having a base, and a heat pipe embedded in the base. A groove is defined in the base. The groove is enclosed by a top surface and two sidewalls slantwise extending downwardly and inwards from opposite edges of the top surface. A width of a bottom portion of the groove is shorter than that of a top portion of the groove. The heat pipe includes an evaporation portion directly pressed in the groove by punching and fully contacts with the groove. The evaporating portion is flattened when it is fully engaged in the groove to directly contact with an electronic component. The method involves directly pressing the evaporation portion of the heat pipe into the groove of the base.

14 Claims, 6 Drawing Sheets

U.S. PATENT DOCUMENTS

2007/0089858 A1* 4/2007 Andberg et al. ............ 165/80.4
2007/0246189 A1* 10/2007 Lin et al. ................... 165/80.3
2007/0258210 A1* 11/2007 Xia et al. .................... 361/695
2007/0261244 A1* 11/2007 Cheng et al. ............. 29/890.03
2007/0261822 A1* 11/2007 Lin et al. ............... 165/104.33
2008/0055857 A1* 3/2008 Chen et al. ................. 361/703
2008/0169089 A1* 7/2008 Wu et al. ............... 165/104.33

FOREIGN PATENT DOCUMENTS

JP       10141877 A  *  5/1998
JP       2007218439 A  *  8/2007

* cited by examiner

HEAT DISSIPATION DEVICE AND A METHOD FOR MANUFACTURING THE SAME

BACKGROUND OF THE INVENTION

1. Field of the Invention

The present invention relates to a heat dissipating device having a heat pipe and method for manufacturing the same, wherein the heat pipe is directly mounted into the heat dissipation device.

2. Description of Related Art

A computer central processing unit (CPU) is the core controller of electrical signals in the contemporary personal computers. Continued development of the CPUs has enabled them to perform more and more functions. Heat generated by the CPUs has thus increased enormously. Such heat can adversely affect the operational stability of the computers. Measures must be taken to efficiently remove the heat from the CPU. Typically, a dissipation device having great heat conductivity is mounted on the CPU to remove the heat therefrom.

The conventional heat dissipation device commonly comprises a heat sink thermally connecting with the CPU and a heat pipe sandwiched between the heat sink and the CPU. The heat pipe transfers heat generated by the CPU to the heat sink. The heat sink comprises a base. A groove is defined in the base to receive the heat pipe. The heat pipe is soldered in the groove of the base with solder cream. The solder cream is adhered to a surface of the heat pipe and connects with the base of the heat sink. Heat generated by the CPU is absorbed by the heat pipe, then transferred to the solder cream, finally transferred to the base of the heat sink. Thus, heat dissipation efficiency of the heat dissipation device is decreased because of a thermal resistance of the solder cream.

Thus, it is desired to devise a heat dissipating device which having a heat pipe can be directly mounted thereon without any solder cream.

SUMMARY OF THE INVENTION

A heat dissipation device and a method for fabrication thereof are disclosed. The heat dissipation device includes a heat sink having a base, and a heat pipe embedded in the base. A groove is defined in the base. The groove is enclosed by a top plate and two sidewalls slantwise extending downwardly and inwards from opposite edges of the top surface. A width of a bottom portion of the groove is shorter than that of a top portion of the groove. The heat pipe includes an evaporation portion directly pressed in the groove by punching and fully contacts with the groove. The evaporating portion is flattened when it is fully engaged in the groove to directly contact with an electronic component. The method involves directly pressing the evaporation portion of the heat pipe into the groove of the base.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
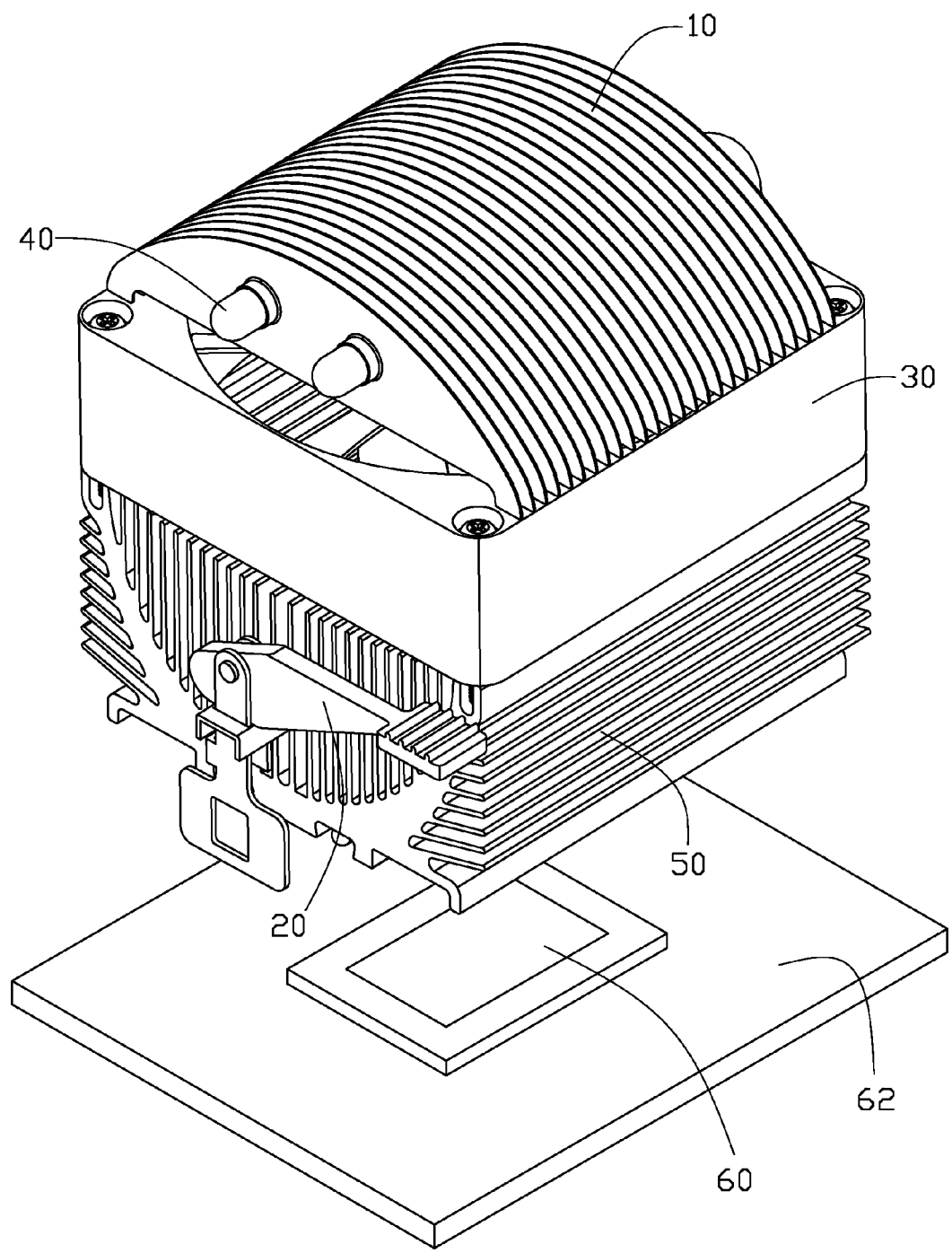
FIG. 1 is an assembled view of a heat dissipation device in accordance with a preferred embodiment of the present invention.
Figure 2:
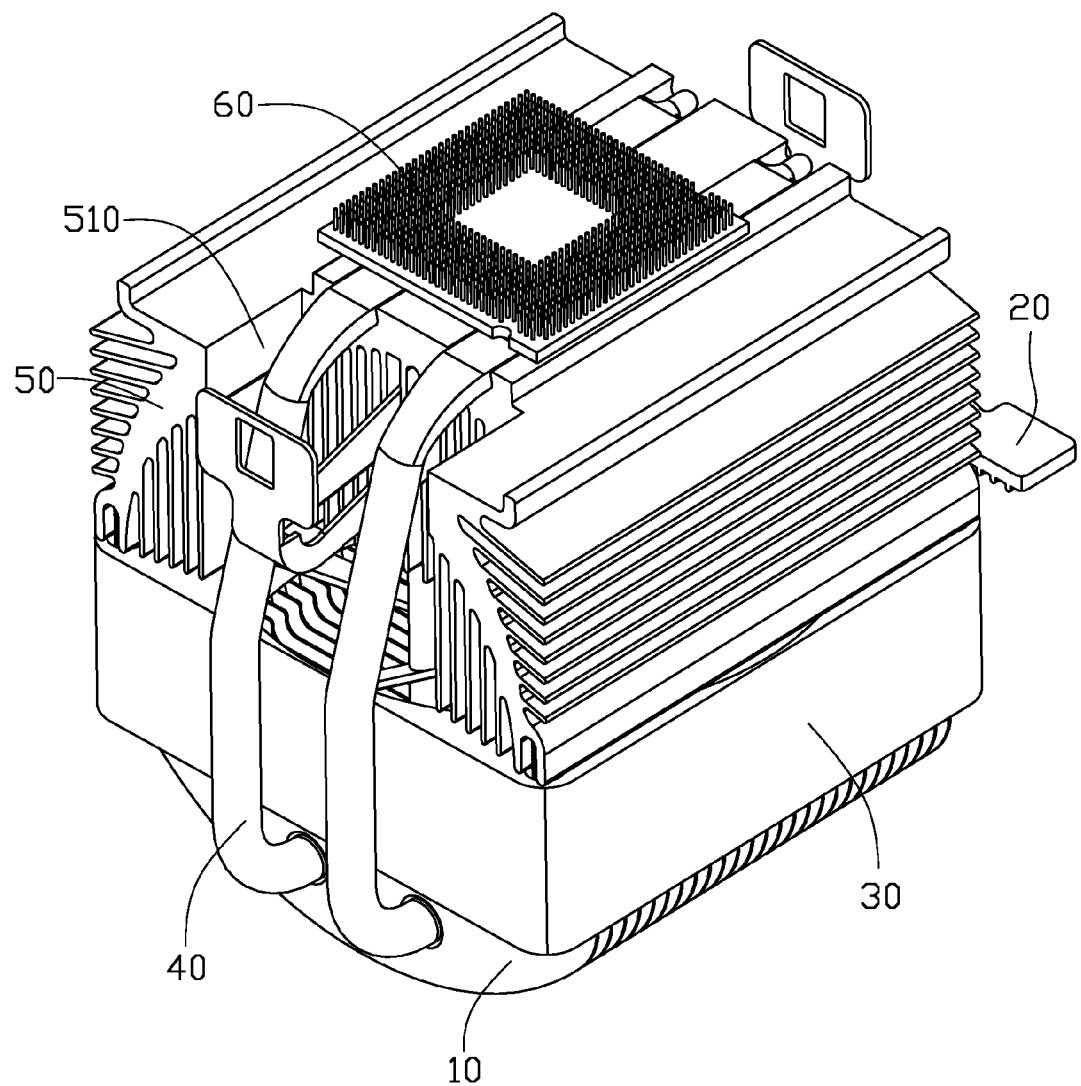
FIG. 2 is similar to FIG. 1, but viewed from a different aspect.

Referring to FIGS. 1-2, they illustrate a heat dissipation device for dissipating heat generated by an electronic component 60 mounted on a printed circuit board 62. The heat dissipation device comprises a first heat sink 10, a second heat sink 50 thermally contacting with the electronic component 60, a fan 30 sandwiched between the first and second heat sinks 10, 50 and a pair of parallel U-shaped heat pipes 40 connecting with the first and second heat sinks 10, 50. A clip 20 spans across the second heat sink 50 to secure the second heat sink 50 on the printed circuit board 62.

Figure 3:
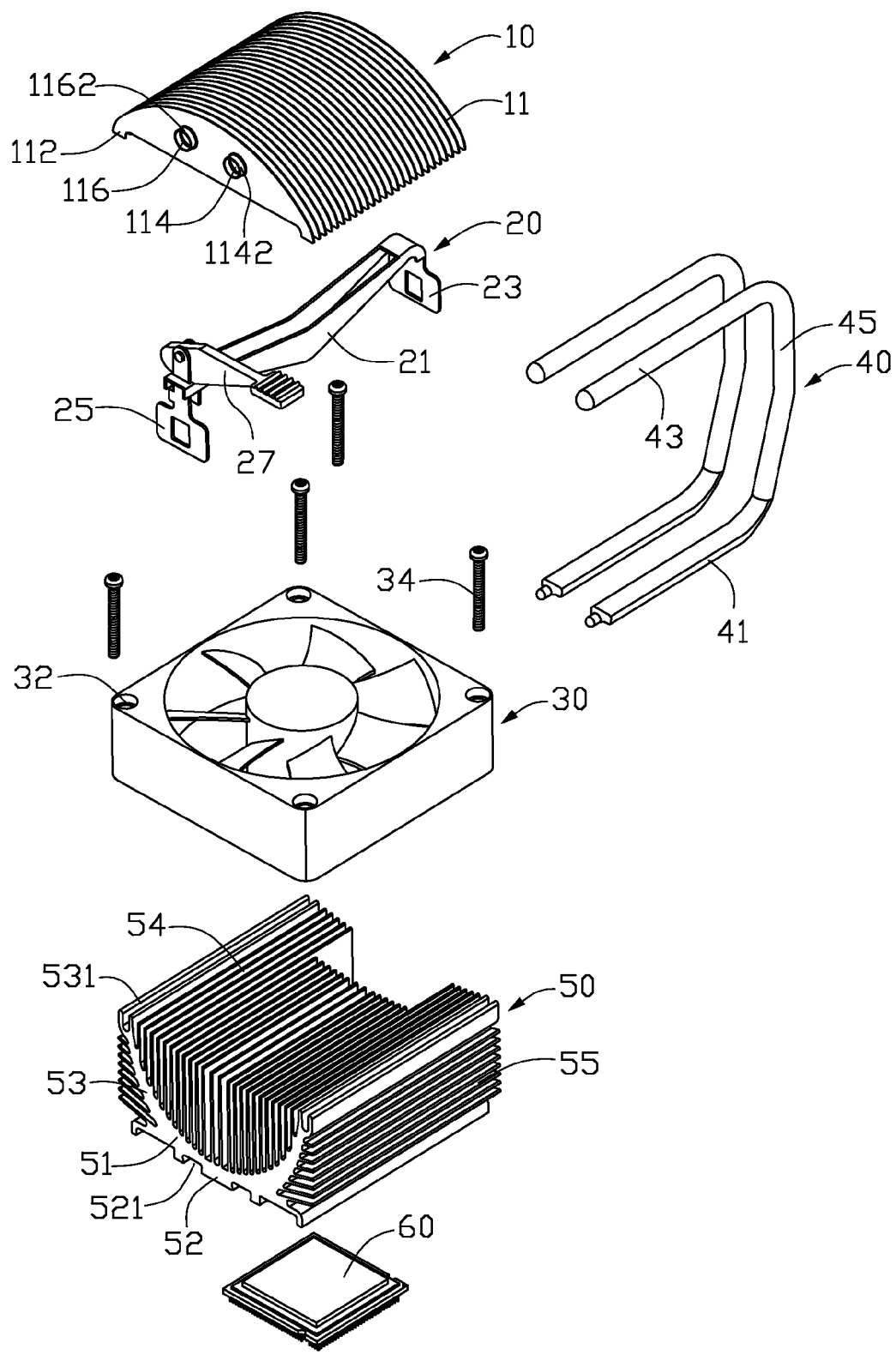
FIG. 3 is an exploded view of FIG. 1.
Figure 4:
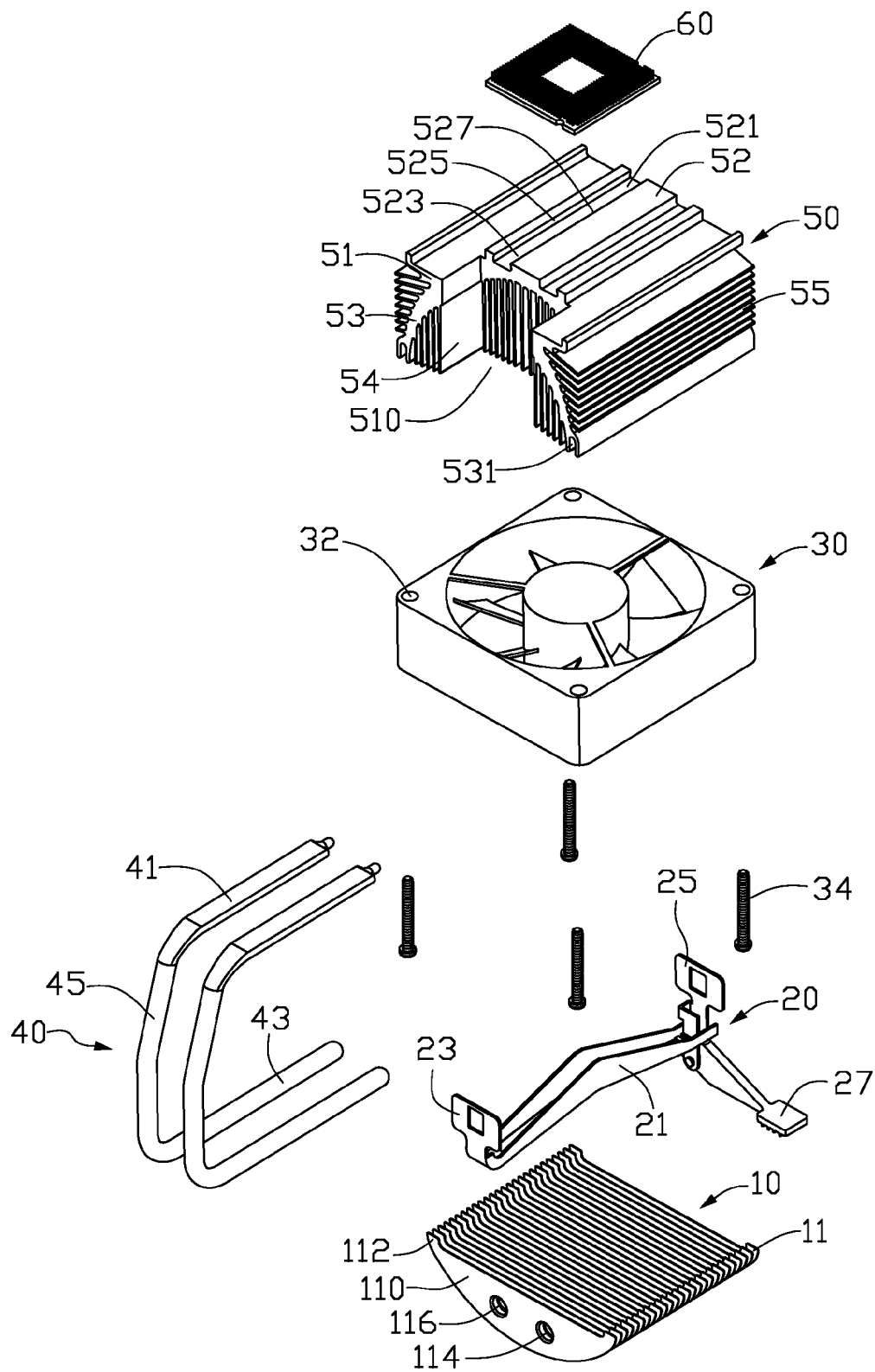
FIG. 4 is an exploded view of FIG. 2.

Referring to FIGS. 3-4 also, each heat pipe 40 comprises an evaporating portion 41, a condensing portion 43 and a connecting portion 45 interconnecting the evaporation portion 41 and the condensing portion 43. The evaporating portion 41 and the condensing portion 43 extend from two opposite ends of the connecting portion 45 in the same direction, and are parallel to each other.

The first heat sink 10 consists of a plurality of vertical fins 11. The fins 11 are parallel to each other, and spaced from each other with predetermined distance, thus a plurality of vertical airflow channels is defined between the fins 11. Each fin 11 has an arc-shaped configuration and comprises an arched body 110 and two legs 112 extending downwardly from lateral ends of the body 110. The legs 112 engage with lateral sides of the fan 30. Each body 110 is perforated with two through holes 114, 116 at a centre portion thereof respectively. Annular sidewalls 1142, 1162 are formed during punching the through holes 114, 116 respectively. The sidewalls 1142, 1162 are soldered together respectively, thus the fins 11 are assembled together and two circular passages (not labeled) are defined respectively and a flat bottom surface (not labeled) is formed between the legs 112. The condensing portions 43 of the heat pipes 40 are soldered into the passages, so that the first heat sink 10 and the heat pipe 40 are assembled together.

Figure 5:
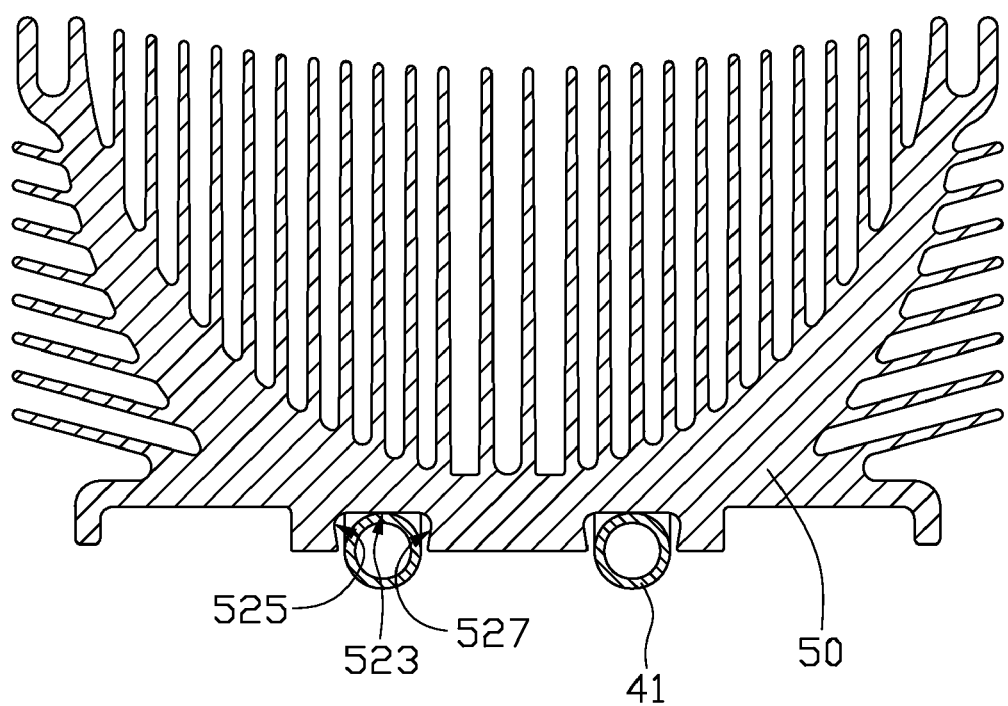
FIG. 5 is a cross-section view of heat pipes and a second heat sink of FIG. 1 before heat pipes are flattened.

The second heat sink 50 is formed by aluminum extrusion. The second heat sink 50 comprises a substantially rectangular base 51. A rectangular cutout 510 shown in FIG. 4) is defined at a center of a rear portion of the second heat sink 50 to prevent the heat pipes 40 from interfering with the second heat sink 50. A protrusion 52 protrudes downwardly from a central portion of a bottom surface of the base 51 for contacting with the electronic component 60. Two spaced elongated grooves 521 are defined at a bottom portion of the protrusion 52. Referring to FIG. 5, each groove 521 is enclosed by an elongated top plate 523 and two sidewalls 525, 527 slantwise extending downwardly and inwards from opposite edges of the top plate 523 thereof. The top plate 523 and the sidewalls 525, 527 are flat. Thus, a width of a bottom portion of each groove 521 is narrower than that of a top portion of each groove 521.

Referring to FIGS. 3-4 again, a pair of wings 53 respectively extend upwardly and outwardly from a center of a top surface of the base 51 to render the wings 53 to have a substantially arc-shaped configuration. Each wing 53 defines an elongated slot 531 at a distal end thereof. The slot 531 extends from a front side to a rear side of the second heat sink 50. The slots 531 facilitate to mount the fan 30 on the second heat sink 50. A plurality of vertical fins 54 extends upwardly from upper sides of the wings 53, and is located between the wings 53. The fins 54 extend from a front end to a rear end and are parallel arranged from a left side to a right side of the second heat sink 50. The fins 54 are perpendicular to the fins 11 of the first heat sink 10. Top terminations of the fins 54 corporately define a top surface which is slightly concave toward a centre of the second heat sink 50. The fins 54 are spaced from each other with a predetermined distance, thus a plurality of vertical airflow channels along a vertical direction is defined between the fins 54. The vertical airflow channels extend from the front end to the rear end of the second heat sink 50. A plurality of lateral fins 55 extends outwardly from lateral sides of the wings 53 and is angled with the fins 54. The fins 55 are located between the slot 531 and the base 51 and parallel to each other. Top terminations of the fins 55 corporately define a flat surface towards lateral sides of the second heat sink 50. The fins 55 are spaced from each other, thus, a plurality of horizontal airflow channels along a horizontal direction is defined between the fins 55. The horizontal airflow channels extend from the front side to the rear side of the second heat sink 50.

The clip 20 spans across the fins 54 of the second heat sink 50 and cooperates with the printed circuit board 62 to mount the second heat sink 50 on the printed circuit board 62. The clip 20 comprises an elongated body 21, a first hook plate 23, a second hook plate 25, and an actuating member 27 pivotally engaged with the second hook plate 25. When the body 21 of the clip 20 extends through channels of the fins 54 of the second heat sink 50 with the first and second hook plate 23, 25 which engage with the printed circuit board 62, the actuating member 27 is rotated downwardly; thus, the second heat sink 50 is secured on the printed circuit board 62.

Figure 6:
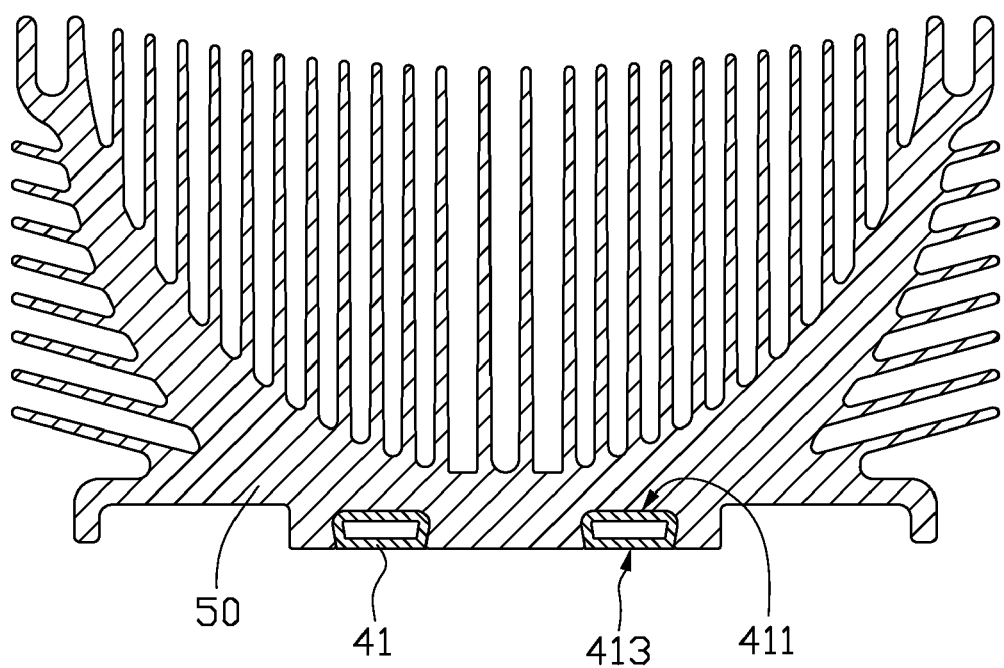
FIG. 6 is similar to FIG. 5, but the heat pipes have been flattened.

Referring to FIGS. 2, and 5-6, in assembly, the condensing portions 43 of the heat pipes 40 are soldered into the through holes 114, 116 of the first heat sink 10. The fan 30 is assembled to the second heat sink 50 via the self-tapping screws 34. The second heat sink 50 is mounted on the printed circuit board via the clip 20. The evaporating portions 41 of the heat pipes 40 are received in the grooves 521. In original, the evaporating portions 41 are cylindrical and top portions of the evaporating portions 41 contact with the top plates 523 of the grooves 521. Then, the evaporating portions 41 are flattened with deformation by extrusion. Each flattened evaporation portion 41 has a top surface 411 and a bottom surface 413 opposite to the top surface 411. A width of the top surface 411 of each evaporation portion 41 is larger than that of the bottom surface 413 of the evaporation 41 according to a configuration of each groove 521. In this state, each evaporating portion 41 fully contacts with the top plate 523 and the sidewalls 525, 527. Each evaporating portion 41 is firmly embedded in the groove 521 because the width of the bottom portion of each groove 521 is narrower than that of the top portion. The bottom surfaces 413 of the evaporation portions 41 and a bottom surface of the protrusion 52 are coplanar. The evaporating portions 41 and the protrusion 52 contact with the electronic component 60 to absorb heat generated by the electronic component 60.

A method for manufacturing the above-described heat dissipation device comprises following steps: (1) providing a first heat sink 10 having a plurality of fins 11; (2) providing a second heat sink 50 having a base 51 and a plurality of fins 54, 55; (3) punching a groove 521 in the base 51 of the second heat sink 50, the groove 521 having a pair of opposite side walls 525, 527, wherein a distance between the side walls 525, 527 at a top is larger than that at a bottom; (4) providing a straight heat pipe 40; (5) bending the heat pipe 40 to have a U-shaped configuration in such a manner that the heat pipe 40 comprises a cylindrical evaporating portion 41 and a cylindrical condensing portion 43; (6) pressing the evaporating portion 41 of the heat pipe 40 into the groove 521 and extending the condensing portion 43 through the first heat sink 10; (7) pressing the evaporating portion 41 to be flattened.

In use, heat generated by the electronic component 60 is absorbed by the second heat sink 50 and the evaporating portions 41 of the heat pipes 40, then transferred to the first heat sink 10 via the heat pipes 40. During operation of the fan 30, a large amount of airflow generated by the fan 30 is drawn into the heat dissipation device. The airflow is drawn from the vertical airflow channels of the first heat sink 10 into the vertical airflow channels of the second heat sink 50 along the vertical direction, then a part airflow exhausted out the front and rear sides of the second heat 50, another part airflow exhausted out the second heat sink 50 along the horizontal airflow channels of the second heat sink 50, thereby taking the heat away therefrom.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat generated by an electronic component mounted on a printed circuit board, the heat dissipation device comprising:
 a first heat sink thermally contacting with the electronic component, the first heat sink having a base, a groove defined in the base, the groove enclosed by a top plate, two sidewalls slantwise extending downwardly and inwards from opposite edges of the top plate, whereby a width of a bottom portion of the groove is narrower than that of a top portion of the groove; a second heat sink comprising a plurality of fins, each of the fins comprising an arched body and two legs extending downwardly from lateral ends of the body, respectively;
 a fan sandwiched between the first and second heat sinks, the first heat sink supporting the fan, the legs of the fins of the second heat sink engaging with lateral sides of a top surface of the fan; and
 a heat pipe comprising an evaporating portion and an condensing portion, the evaporating portion being directly pressed in the groove and fully contacting with the groove of the base of the first heat sink, wherein the evaporating portion is cylindrical before fully engaged in the groove, the evaporating portion is flattened when it is fully engaged in the groove and has a corresponding configuration of the groove, the condensing portion extending through the fins of the second heat sink.

2. The heat dissipation device as claimed in claim 1, wherein the base of the first heat sink protrudes downwardly to form a protrusion, the groove defined in the protrusion, the heat pipe having a bottom surface coplanar with a bottom surface of the protrusion of the base.

3. The heat dissipation device as claimed in claim 1, wherein the evaporation portion of the heat pipe has a top surface and a bottom surface opposite to the top surface, and a width of the top surface is larger than that of the bottom surface.

4. The heat dissipation device as claimed in claim 1, wherein the first heat sink comprises a pair of wings extends upwardly and outwardly from a top surface of the base respectively, and two elongated slots are defined at distal ends thereof respectively to mount the fan thereon.

5. The heat dissipation device as claimed in claim 4, wherein a plurality of vertical fins extends upwardly from an upper side of the wings of the first heat sink, and the vertical fins are parallel to and spaced from each other.

6. The heat dissipation device as claimed in claim 4, wherein a plurality of lateral fins extend outwardly from lateral sides of the wings of the first heat sink and parallel to and spaced from each other.

7. The heat dissipation device as claimed in claim 1, wherein the fins of the second heat sink are parallel to and spaced from each other.

8. The heat dissipation device as claimed in claim 1, wherein the heat pipe has a U-shaped configuration.

9. The heat dissipation device as claimed in claim 1 further comprising a clip spanning across the heat sink and engaging with the printed circuit board to mount the heat sink to the printed circuit board.

10. The heat dissipation device as claimed in claim 1, wherein the top plate and the sidewalls are flat.

11. The heat dissipation device as claimed in claim 1, wherein a cutout is defined at a center of an end of the first heat sink to prevent the heat pipe from interfering with the first heat sink.

12. A heat dissipation device adapted for dissipating heat generated by an electronic component mounted on a printed circuit board, the heat dissipation device comprising:
　a first heat sink comprising a plurality of fins;
　a second heat sink contacting with the electronic component and comprising a base and a plurality of fins extending from the base and spaced from each other, a groove defined in the base, a width of a bottom portion of the groove being shorter than that of a top portion, a cutout is defined at a center of an end of the second heat sink to prevent the heat pipe from interfering with the second heat sink;
　a heat pipe comprising a flattened evaporating portion directly embedded in the groove of the second heat sink and a condensing portion extending through the fins of the first heat sink; and
　a fan sandwiched between the first and second heat sink;
　wherein each of the fins of the first heat sink comprises an arched body and two legs extending downwardly from lateral ends of the body, respectively, the second heat sink supports the fan, and the legs of the fins of the first heat sink engaging with lateral sides of a top surface of the fan.

13. The heat dissipation device as claimed in claim 12, wherein the groove is enclosed by a flat top plate, two flat sidewalls slantwise extending downwardly and inwards from opposite edges of the top plate.

14. The heat dissipation device as claimed in claim 12, wherein the fins of the first and second heat sinks are spaced from each other.

* * * * *